(12) United States Patent
Sood

(10) Patent No.: US 9,337,841 B1
(45) Date of Patent: May 10, 2016

(54) CIRCUITS FOR AND METHODS OF PROVIDING VOLTAGE LEVEL SHIFTING IN AN INTEGRATED CIRCUIT DEVICE

(71) Applicant: Xilinx, Inc., San Jose, CA (US)

(72) Inventor: Santosh Kumar Sood, New Delhi (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/507,260

(22) Filed: Oct. 6, 2014

(51) Int. Cl.
*H03L 5/00* (2006.01)
*H03K 19/0185* (2006.01)

(52) U.S. Cl.
CPC .................................. *H03K 19/0185* (2013.01)

(58) Field of Classification Search
CPC ............................................... H03K 3/356113
USPC ................... 327/306, 333; 326/61–62, 80–81
See application file for complete search history.

(56) References Cited

U.S. PATENT DOCUMENTS

| | | | |
|---|---|---|---|
| 5,583,450 A | 12/1996 | Trimberger et al. | |
| 5,600,263 A | 2/1997 | Trimberger et al. | |
| 5,629,637 A | 5/1997 | Trimberger et al. | |
| 5,646,545 A | 7/1997 | Trimberger et al. | |
| 5,701,441 A | 12/1997 | Trimberger | |
| 5,761,483 A | 6/1998 | Trimberger | |
| 5,778,439 A | 7/1998 | Trimberger et al. | |
| 5,784,313 A | 7/1998 | Trimberger et al. | |
| 5,825,662 A | 10/1998 | Trimberger | |
| 5,838,954 A | 11/1998 | Trimberger | |
| 5,880,605 A * | 3/1999 | McManus ...... | H03K 19/018521 326/81 |
| 5,959,881 A | 9/1999 | Trimberger et al. | |
| 5,978,260 A | 11/1999 | Trimberger et al. | |
| 6,025,737 A * | 2/2000 | Patel et al. ........................ | 326/80 |
| 6,263,430 B1 | 7/2001 | Trimberger et al. | |
| 6,480,954 B2 | 11/2002 | Trimberger et al. | |
| 6,563,362 B2 * | 5/2003 | Lambert .......... | H03K 3/356113 326/68 |
| 7,467,175 B2 | 12/2008 | Simkins et al. | |
| 7,467,177 B2 | 12/2008 | Simkins et al. | |
| 7,468,615 B1 | 12/2008 | Tan et al. | |
| 7,472,155 B2 | 12/2008 | Simkins et al. | |
| 7,480,690 B2 | 1/2009 | Simkins et al. | |
| 7,840,627 B2 | 11/2010 | Simkins et al. | |
| 7,840,630 B2 | 11/2010 | Wong et al. | |
| 7,844,653 B2 | 11/2010 | Simkins et al. | |

(Continued)

OTHER PUBLICATIONS

Xilinx, *Level Translation Using Xilinx CoolRunner-II CPLDs*, XAPP785 (v1.0), Jun. 22, 2005, pp. 1-5, Xilinx, Inc., San Jose, California, USA.

(Continued)

*Primary Examiner* — Dinh T Le
(74) *Attorney, Agent, or Firm* — John J. King; Robert M. Brush

(57) ABSTRACT

A circuit for providing voltage level shifting in an integrated circuit includes an inverter having an input coupled to receive an input signal having a first voltage level; an output stage having a first transistor coupled in series with a second transistor, and an output node between the first transistor and the second transistor generating an output signal having a second voltage level. A gate of the second transistor is coupled to an output of the inverter. A pull-up transistor is coupled between a reference voltage having the second voltage level and a gate of the first transistor. A switch is coupled between the gate of the first transistor and the gate of the second transistor to control a voltage at the gate of the first transistor. A method of providing voltage level shifting in an integrated circuit is also disclosed.

18 Claims, 7 Drawing Sheets

(56) References Cited

U.S. PATENT DOCUMENTS

| | | |
|---|---|---|
| 7,849,119 B2 | 12/2010 | Vadi et al. |
| 7,853,632 B2 | 12/2010 | Ching et al. |
| 7,853,634 B2 | 12/2010 | Simkins et al. |
| 7,853,636 B2 | 12/2010 | New et al. |
| 7,860,915 B2 | 12/2010 | Vadi et al. |
| 7,865,542 B2 | 1/2011 | New et al. |
| 7,870,182 B2 | 1/2011 | Thendean et al. |
| 7,882,165 B2 | 2/2011 | Simkins et al. |
| 7,961,013 B2 * | 6/2011 | Yamada ................. 327/108 |
| 8,495,122 B2 | 7/2013 | Simkins et al. |
| 2006/0214718 A1 * | 9/2006 | Chen ....................... 327/333 |
| 2008/0054982 A1 | 3/2008 | Rhee |
| 2009/0315624 A1 * | 12/2009 | Chow et al. ............. 330/291 |
| 2014/0253211 A1 | 9/2014 | Lnu |

OTHER PUBLICATIONS

Tavares, Austin, *Intefacing Virtex-6 FPGAs with 3.3V I/O Standards*, XAPP899 (v1.1), Feb. 5, 2014, pp. 1-13, Xilinx, Inc., San Jose, California, USA.

* cited by examiner

US 9,337,841 B1

CIRCUITS FOR AND METHODS OF PROVIDING VOLTAGE LEVEL SHIFTING IN AN INTEGRATED CIRCUIT DEVICE

TECHNICAL FIELD

The present invention relates generally to integrated circuit devices, and in particular to circuits for and methods of providing voltage level shifting in an integrated circuit device.

BACKGROUND

Integrated circuits are often involved in the transmission of data, both internal to the integrated circuit and with an external device. Data transmission is an important aspect in most integrated circuit devices. Errors in data transmission may not only affect the operation of an integrated circuit, but may also affect the operation of a device or system incorporating the integrated circuit device. Further, data transmission may also affect the performance of an integrated circuit device. For example, the speed of data transmitted may depend upon a voltage level of the data, and therefore the speed of the integrated circuit device.

Data transmission is typically performed according to a predetermined standard, where data signals must conform to certain timing and voltage characteristics. More importantly, data may need to be transmitted in an integrated circuit at a different voltage than an original voltage of the data. For example, an integrated circuit may implement different power reference voltages, where certain circuits of the integrated circuit may operate on a first reference voltage and other circuits may operate on a second reference voltage. Accordingly, it is often necessary to perform a voltage level conversion of a signal in an integrated circuit. Improved circuits for providing voltage level conversion from a certain voltage to a higher voltage are therefore desirable.

SUMMARY

A circuit for providing voltage level shifting in an integrated circuit is disclosed. The circuit comprises an inverter having an input coupled to receive an input signal having a first voltage level; an output stage having a first transistor coupled in series with a second transistor, and an output node between the first transistor and the second transistor generating an output signal having a second voltage level. A gate of the second transistor is coupled to an output of the inverter. A pull-up transistor is coupled between a reference voltage having the second voltage level and a gate of the first transistor. A switch is coupled between the gate of the first transistor and the gate of the second transistor to control a voltage at the gate of the first transistor.

According to another implementation, a circuit for providing voltage level shifting in an integrated circuit comprises a first circuit block coupled to receive a first reference signal having a first voltage level; a second circuit block coupled to receive a second reference signal having a second voltage level; and a voltage level shifting circuit. The voltage level shifting circuit comprises an inverter having an input coupled to receive an input signal having the first voltage level; an output stage having a first transistor coupled in series with a second transistor, and an output node between the first transistor and the second transistor generating an output signal having the second voltage level. A gate of the second transistor is coupled to an output of the inverter. A pull-up transistor is coupled between a reference voltage having the second voltage level and a gate of the first transistor. A switch is coupled between the gate of the first transistor and the gate of the second transistor to control a voltage at the gate of the first transistor.

A method of providing voltage level shifting in an integrated circuit is also described. The method comprises coupling an input signal having a first voltage level to an input of an inverter; coupling a first transistor of an output stage in series with a second transistor of the output stage; coupling a gate of the second transistor to an output of the inverter; coupling a pull-up transistor between a reference voltage having the second voltage level and a gate of the first transistor; controlling the voltage at the gate of the first transistor with a switch coupled between the gate of the first transistor and the gate of the second transistor; and generating an output signal having a second voltage level at an output node between the first transistor and the second transistor.

Other features will be recognized from consideration of the Detailed Description and Claims, which follow.

DETAILED DESCRIPTION

Figure 1:
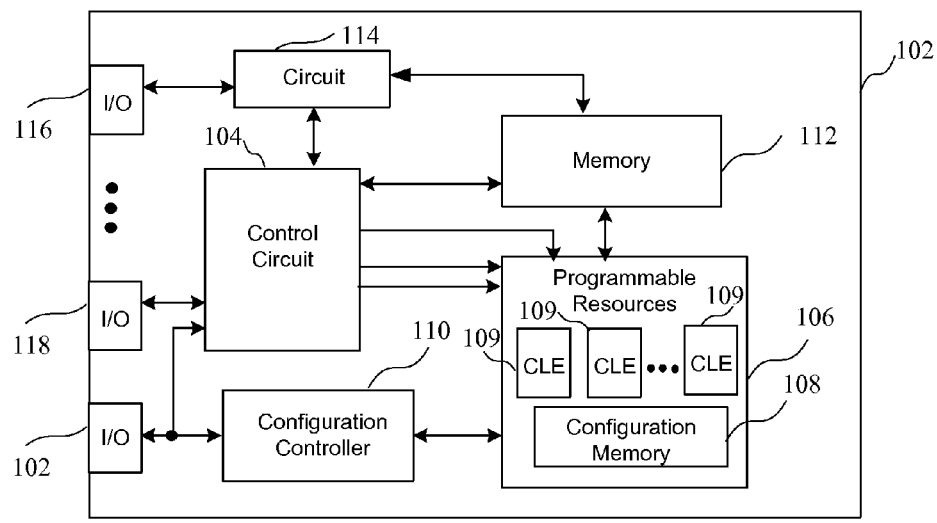
FIG. 1 is a block diagram of an integrated circuit having circuits enabling voltage level shifting.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below describe the level shifting of a signal between two power domains, and find particular application where the levels of two power domains are not far apart. The circuits and methods have the advantage of lower latency and area overhead as compared to conventional level shifters. The level shifter may also be integrated into interconnect fabric of a programmable logic device (PLD), such as a field programmable logic device (FPGA). FPGA fabric is made of CLEs and interconnects, where users can implement custom data paths through the fabric. Such an implementation in the FPGA fabric achieves level shifting without any extra delay overheads as compared to conventional schemes. Individual CLEs/interconnects can be programmed for low power/high speed mode, depending on customer requirements. This could be implemented using a NMOS and PMOS transistor in series with the power supply, and using the NMOS transistor to create a virtual low voltage supply rail of Vdd-Vth. A voltage level shifting circuit can be used to convert a signal having a certain voltage level to a higher voltage level.

More particularly, a circuit for providing voltage level shifting in an integrated circuit may comprise an inverter having an input coupled to receive an input signal having a first voltage level; an output stage having a first transistor coupled in series with a second transistor and an output node between the first transistor and the second transistor generating an output signal having a second voltage level, wherein a gate of the second transistor is coupled to an output of the inverter; and a pull-up transistor coupled between a reference voltage having the second voltage level and a gate of the first transistor. A switch is advantageously coupled between the gate of the first transistor and the gate of the second transistor to control the voltage at the gate of the first transistor, where the switch and the pull-up transistor enable the voltage transition of a signal between a power reference voltage VDDL and higher power reference voltage VDDH. The circuits and methods provide faster voltage level transition with an improved slew rate compared to conventional level shifters having a weak pull-up transistor coupled between a higher voltage and an input of a final inverter generating an output signal.

Turning first to FIG. 1, a block diagram of an integrated circuit having circuits enabling voltage level shifting is shown. In particular, an input/output port 102 is coupled to a control circuit 104 that controls programmable resources 106 having configuration memory 108. Configuration data, which will be described in more detail below in reference to FIGS. 9-11, may be provided to the configuration memory 108 by a configuration controller 110. The configuration data enables the operation of configurable elements 109, which will be described in more detail in reference to FIG. 11. While CLEs are shown and described in detail below, it should be understood that a voltage level shifting circuit may be used with any type of integrated circuit, and may enable a staggered power-up of circuit blocks other than CLEs. A separate memory 112, which may be a non-volatile memory for example, may be coupled to the control circuit 104 and the programmable resources 106. Another circuit 114 may be coupled to the control circuit 104 and the memory 112, and may communication signals external to the integrated circuit device by way of an I/O port 116. Other I/O ports may be coupled to circuits of the integrated circuit device, such as I/O port 118 that is coupled to the control circuit 104 as shown.

Figure 2:
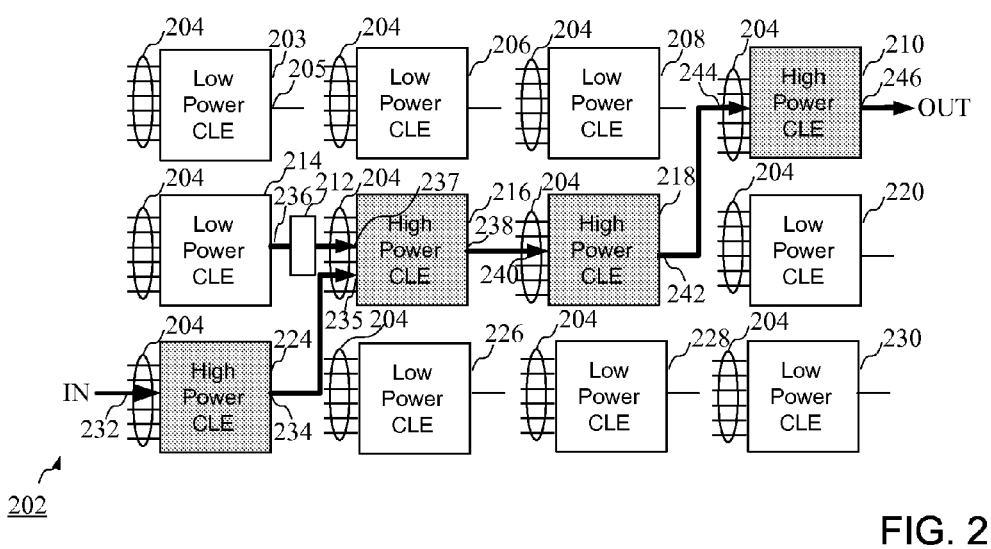
FIG. 2 is a block diagram of a portion of the programmable resources of the integrated circuit of FIG. 1.

Turning now to FIG. 2, a block diagram of a portion 202 of the programmable resources of the integrated circuit of FIG. 1 is shown. A plurality of CLEs, shown here in a matrix, are coupled to receive at least one of a plurality of voltages. While three rows of CLEs including a first row having CLEs 203 and 206-210, a second row having CLEs 214-220, and a third row having CLEs 224-230 is shown, it should be understood that the matrix of CLEs could include a greater number of rows and columns of CLEs. CLEs receiving a first power reference voltage are designated in FIG. 2 as low power CLEs and CLEs receiving a second voltage, which is higher than the first power reference voltage are designated as high power CLEs. Each CLE comprises a plurality of inputs 204 and has at least one output 205.

According to one path through the CLEs of FIG. 2, an input 232 of the high power CLE 224 is coupled to receive an input signal (IN), and an output signal having a high voltage (e.g. VDDH) at an output 234 of the CLE 224 is coupled to an input 235 of the high power CLE 216. The high power CLE 216 is also coupled to an output 236 of a low power CLE 214, and therefore receives an input signal having a lower voltage (e.g. VDDL) at an input 237. An output 238 of the CLE 216 is coupled to an input 240 of the CLE 218, and an output 242 is coupled to an input 244 of CLE 210, which generates an output signal (OUT) at an output 246. However, in order for the high power CLE 216 to process data at its inputs 204, a voltage level converter 212 is included between the output of the CLE 214 and an input of the CLE 216. That is, signals crossing from Low Power Domain (e.g. the VDDL domain) to High Speed Domain (e.g. the VDDH domain), or from one high speed domain to another high speed domain, need level shifting, as will be described in more detail below.

While the voltage level converter 212 is shown separate from the CLE and implemented as a part of the interconnect structure, as will be described in more detail below, it should be understood that the voltage level converter 212 could be implemented as a part of the CLE. Further, while only a single voltage level converter 212 is shown as needed in the particular data path highlighted in FIG. 2, it should be understood that a voltage level converter may associated with each output of each CLE, where the voltage level converter may be selectively used, as will be described in more detail below.

Figure 3:
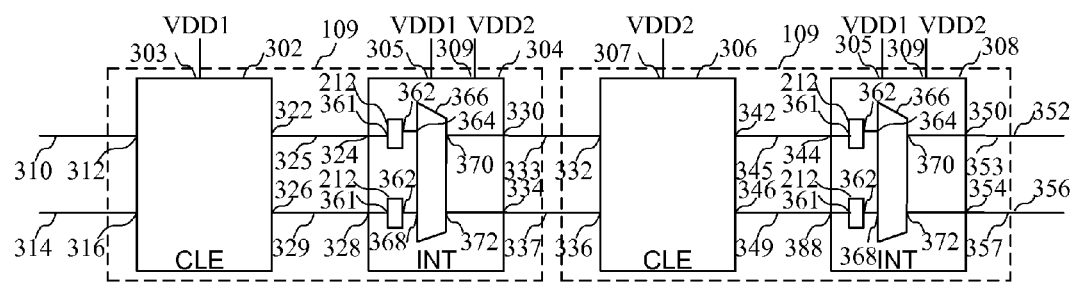
FIG. 3 is a block diagram of two configurable logic elements of the circuit of FIG. 2.

Turning now to FIG. 3, a block diagram of two configurable logic elements 109 of the circuit of FIG. 2 is shown. FIG. 3 shows a first CLE 109 having a CLE block 302 receiving a reference voltage at an input 303, and a corresponding interconnect block 304 receiving reference voltages at inputs 305 and 309, the outputs of which are coupled to a second CLE 109 having a CLE block 306 and a corresponding interconnect block 308. The circuit arrangement of FIG. 3 shows a configuration where an output of the CLE 302 is at a first voltage level VDD1 (based upon the VDD1 reference voltage applied to the input 303) and is converted to a higher voltage level VDD2 so that it is an appropriate voltage level to be received by the CLE block 302, which operates at the higher voltage level VDD2 received at the input 307. The operation of the voltage level converter 212, which receives both VDD1 and VDD2, will be described in more detail in reference to FIG. 6. The CLE blocks 302 and 306 are shown in more detail in FIG. 10.

Referring now to the connections of the circuit of FIG. 3, a first interconnect line 310 is coupled to an input 312 of the CLE block 302, while a second interconnect line 314 is coupled to a second input 316. While only two inputs are shown, additional inputs to the CLE could be implemented as shown in FIG. 2. Further, the interconnect connections in FIG. 3 are provided to show these two adjacent CLE blocks that are connected. However, it should be understood that CLEs 109 may be connected in different rows or columns as shown in FIG. 2 and described below in reference to FIG. 4. An output 322 of the CLE block 302 is coupled to an input 324 of the interconnect block 304 by an interconnect line 325, and an output 326 is coupled to an input 328 by an interconnect line 329.

Interconnects are also provided for the second CLE 109. In particular, interconnect are provided between the interconnect block 304 of the first CLE 109 and the CLE block 306 of the second CLE 109. An output 330 of the interconnect block 304 is coupled to an input 332 of the CLE block 306 by an interconnect line 333, and an output 334 is coupled to an input 336 by an interconnect line 337. An output 342 of the CLE block 306 is coupled to an input 344 of the interconnect block 308 by an interconnect line 345, and an output 346 is coupled to an input 348 by an interconnect line 349. Finally, outputs of the interconnect bloc 308 enable providing signals that may be routed to other CLEs. That is, an output 350 enables a first output signal to be generated on a signal line 352 and an output 354 enables a second output signal to be generated on a signal line 356. Accordingly, level shifters are always in the paths, and based on the power supplies to level shifters (e.g. controlled by power switches in the design), each level shifter is working in one of two states (VDD1=VDD2) or (VDD1<VDD2).

The interconnect block 304 comprises two paths associated with a corresponding input 324 and 328, each path having a voltage level shifter 212. In particular, the input 324 of the interconnect block 304 is coupled to an input 361 of the voltage level shifter 212, and an output 362 is coupled to an input 364 of a multiplexer 366. The input 328 is coupled to a second voltage level shifter 212 and corresponding input 368 of the multiplexer 366, where selected output signals are generated at the outputs 370 and 372. Each voltage level shifter is similarly implemented in the other interconnect blocks of FIG. 3 as described above for the voltage level shifter 212 coupled to the input 324.

Figure 4:
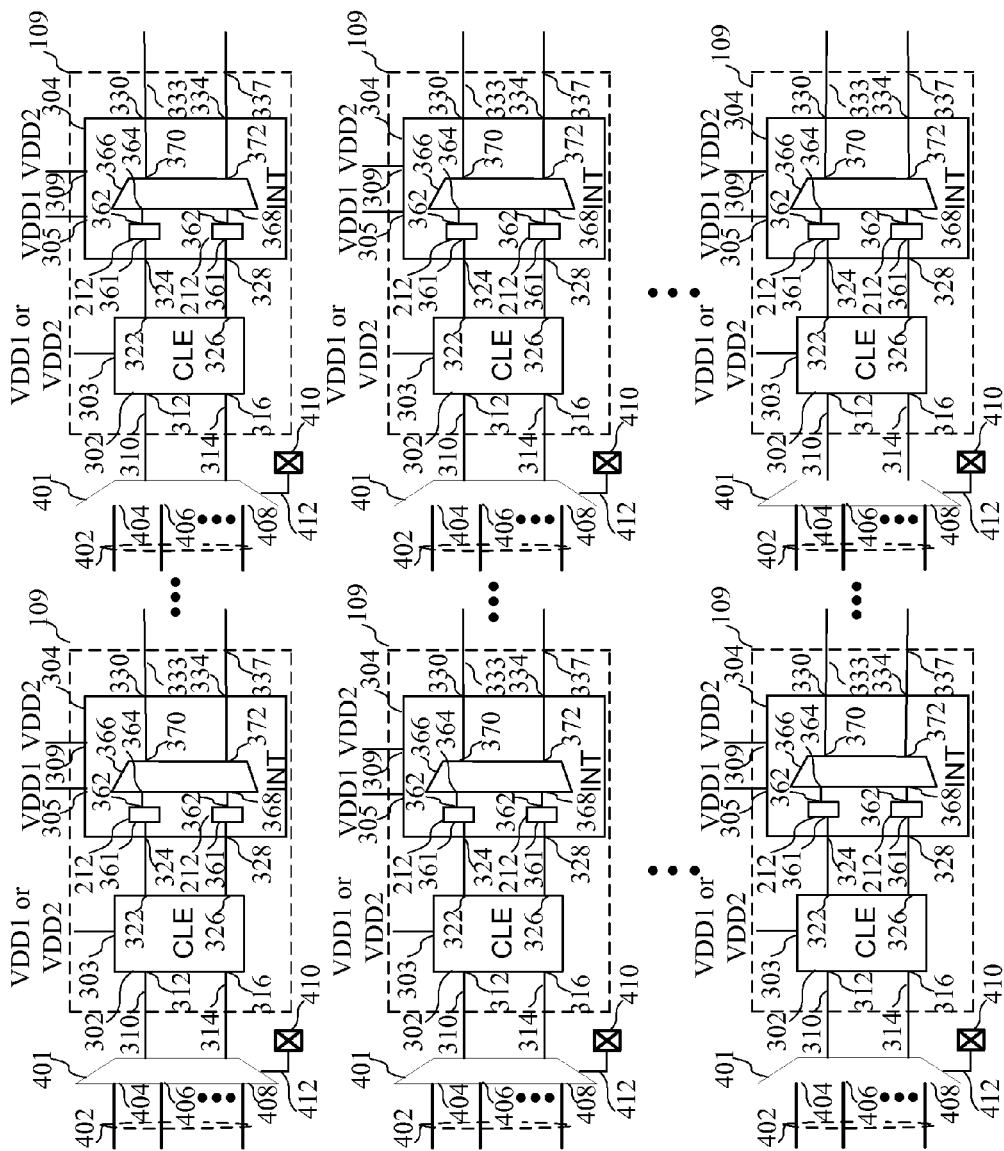
FIG. 4 is a block diagram of an array of configurable logic elements of the circuit of FIG. 2 having user selectable voltage level shifting circuits.

Turning now to FIG. 4, a block diagram of an array of configurable logic elements 109 having voltage level shifting circuits is shown. The array includes a plurality of CLEs 109 as described in FIG. 3, where interconnect circuits enable the routing of a plurality of input signals to the inputs of a corresponding CLE block. In particular, a selection circuit 401, shown here as a multiplexer, is coupled to receive a plurality of input signals on input lines 402 that are coupled to corresponding inputs 404-408 to the selection circuit 401. A control value 410, which may be generated by a memory element storing a configuration bit for example, is coupled to a control line 412. As is apparent from the output lines 333 and 337 of the interconnect block 304 and the input lines 402, interconnect elements (which will be described in more detail in reference to FIG. 9) enable the connection of various inputs and outputs, as shown for example in FIG. 2. By integrating the new level shifters in the interconnect elements of an FPGA for example, a desired level shifting can be provided with minimal additional delay in the data path as compared to conventional level shifters.

Figure 5:
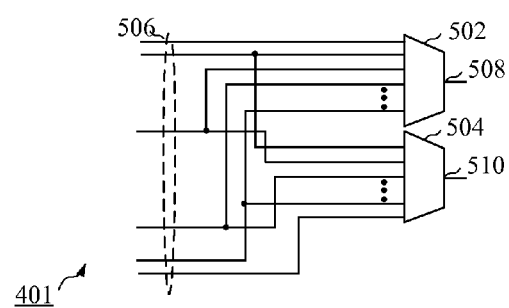
FIG. 5 is a block diagram of a selection circuit 401 of the circuit of FIG. 4.

Turning now to FIG. 5, a block diagram of a selection circuit 401 of the circuit of FIG. 4 is shown. More particularly, the selection circuit 401 comprises a first multiplexer 502 and a second multiplexer 504, each of which is coupled to receive a plurality of signals on a plurality of signal lines 506. A selected output for the first and second multiplexers 502 and 504 are generated at outputs 508 and 510, respectively. The circuit of FIG. 5 enables selectively routing signals between inputs and outputs of the CLEs 109 of FIG. 4 for example.

Figure 6:
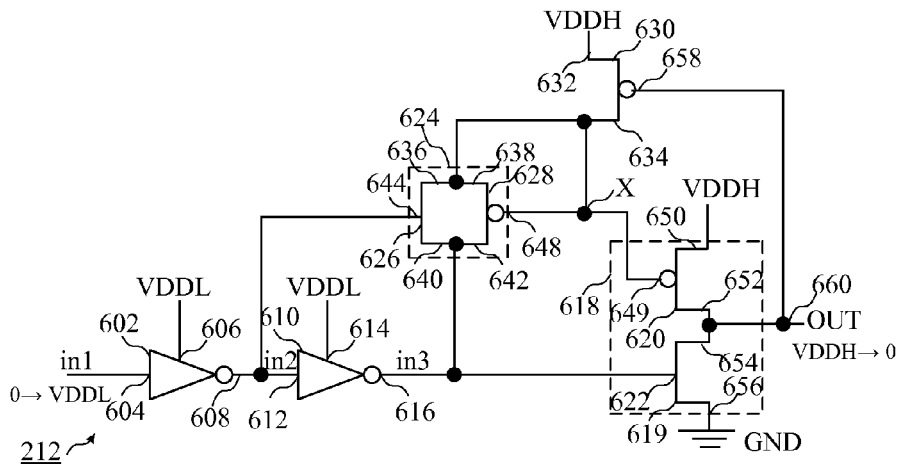
FIG. 6 is a block diagram of the voltage level shifting circuit 212 of FIG. 2.
Figure 7:
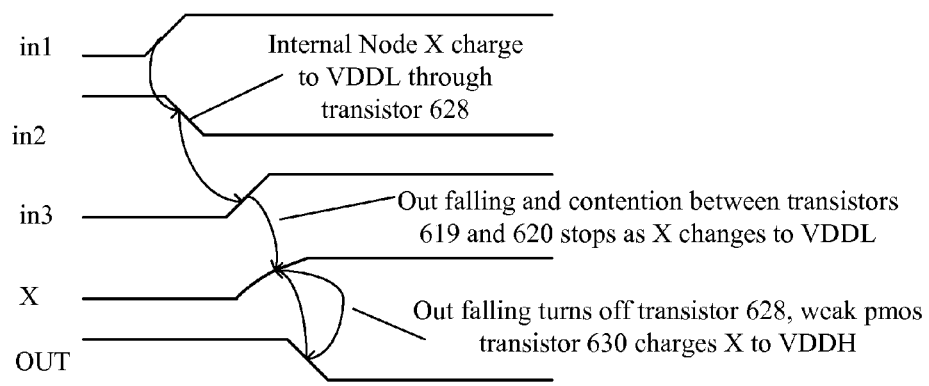
FIG. 7 is a timing diagram showing the operation of the level shifting circuit of FIG. 5.

Turning now to FIG. 6, a block diagram of the voltage level shifting circuit 212 is shown in conjunction with the timing diagram of FIG. 7. In particular, the voltage level shifting circuit 212 comprises a first inverter 602 having an input 604 that is coupled to receive an input signal and an input 606 coupled to receive an reference voltage, shown here as a first reference voltage VDDL. An output 608 of the first inverter 602 is coupled to a second inverter 610 at an input 612, which also receives the reference voltage at an input 614 and where an output signal is generated at an output 616. As shown in FIG. 6, each of the inverters 602 and 610 are coupled to receive a first power reference voltage VDDL, which is lower than a second power reference voltage VDDH. The output of the inverter 610 is coupled to an output stage 618 having a first transistor 619 and a second transistor 620 coupled in series between the power reference voltage VDDH and ground (GND).

A switch 624 comprises a first transistor 626, implemented as an n-channel transistor, and a second transistor 628, implemented as a p-channel transistor, that are coupled in parallel. The switch 624 is coupled between a pull-up transistor 630 and the output 616 of the inverter 610. More particularly, a source 632 of the p-channel transistor 630 is coupled to VDDH. First and second transistors 626 and 628 of the switch 624 are coupled in parallel, where a first source/drain pair of the transistors 626 and 628 is coupled to the drain 634 of the transistor 630 and a second source/drain pair of the transistors 626 and 688 is coupled to the output 616 of the inverter 610. That is, a drain 636 of the n-channel transistor 626 and a source 638 of the p-channel transistor 628 are coupled to the drain 634 of the transistor 630, while a source 640 of the transistor 626 and a drain 642 of the transistor 628 are coupled to the output 616 of the inverter 610.

A gate 648 of the transistor 628 is coupled to a gate 649 of the transistor 620, while a source 650 is coupled to VDDH and a drain 652 is coupled to a drain 654 of the transistor 619. The source 656 of the transistor 619 is coupled to ground. The node at the drain 652 and the drain 654 are coupled to the gate 658 of transistor 630. As will be described in more detail below, the voltage at the node X is controlled by the selective switching of switch 624 to generate an output signal (OUT), at the node at the drain 652 and the drain 654, having a voltage of VDDH.

As is shown in FIG. 7, an example of transitions between a logical 1, represented by either VDDL or VDDH, and a logical 0 is shown at certain nodes, where logical 1s have a voltage level of VDDL at the outputs of the first and second inverters 602 and 610, while the logical 1 at the output of the output stage 618 has a logical 1 that has been level shifted to a higher voltage of VDDH. As the in1 signal goes high at the input of the inverter 602, the in2 signal at the output 608 and input 612 of the inverter 610 goes low. During this time, the internal node X charges to VDDL through transistor 628. That is, as the in3 signal at the gate of the transistor 619 starts to ramp up, the contention between transistor 619 and 620 stops as the voltage at node X changes to VDDL (turning on transistor 619 and turning off transistor 620. As the voltage at the output node continues to fall, transistor 628 turns off, and the weak pull-up transistor 630 charges X to the VDDH voltage level through transistor 630. Accordingly, a first phase of the transition of the voltage of the node X is driven by the transistor 628. As in3 increases and the voltage at node X starts to increase to VDDL, transistor 628 starts to turn off and the OUT signal starts to go low to turn on transistor 630 in a second phase and pull the voltage at node X to VDDH.

The circuits and methods of providing level shifters have minimal latency overhead in High Speed mode (e.g. VDDH=VDDL=0.9 or 1.0V), as well providing proper shifting in the Low power mode (e.g. VDDL=0.8V and VDDH=0.9 or 1.0V). The circuits and methods provide faster voltage level transition with an improved slew rate compared to conventional level shifters having a weak pull-up transistor coupled between a higher voltage and an input of a final inverter generating an output signal. It should be noted that level shifters could be implemented based upon existing level shifter structures and in devices having level shifters, where the only additional elements to enable the implementation of the level shifter of FIG. 6 would be the switch 624, transistor 630 and the configuration of output stage 618.

Figure 8:
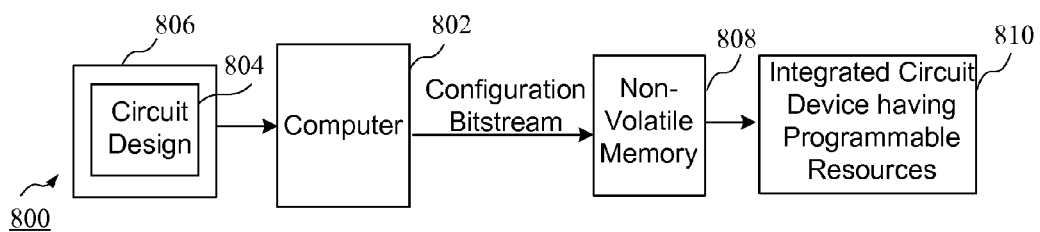
FIG. 8 is a block diagram of a system for programming a device having programmable resources.

Turning now to FIG. 8, a block diagram of an exemplary system for programming a device having programmable resources is shown. In particular, a computer 802 is coupled to receive a circuit design 804 from a memory 806, and generate a configuration bitstream that is stored in the non-volatile memory 808. As will be described in more detail below, the circuit design may be a high level design, such as a circuit design defined in a hardware description language (HDL). Also, the computer may be configured to run software that generates a configuration bitstream that is stored in the non-volatile memory 808 and provided to an integrated circuit 810 that may be a programmable integrated circuit, such as the integrated circuit described below in FIGS. 9 and 10.

Figure 9:
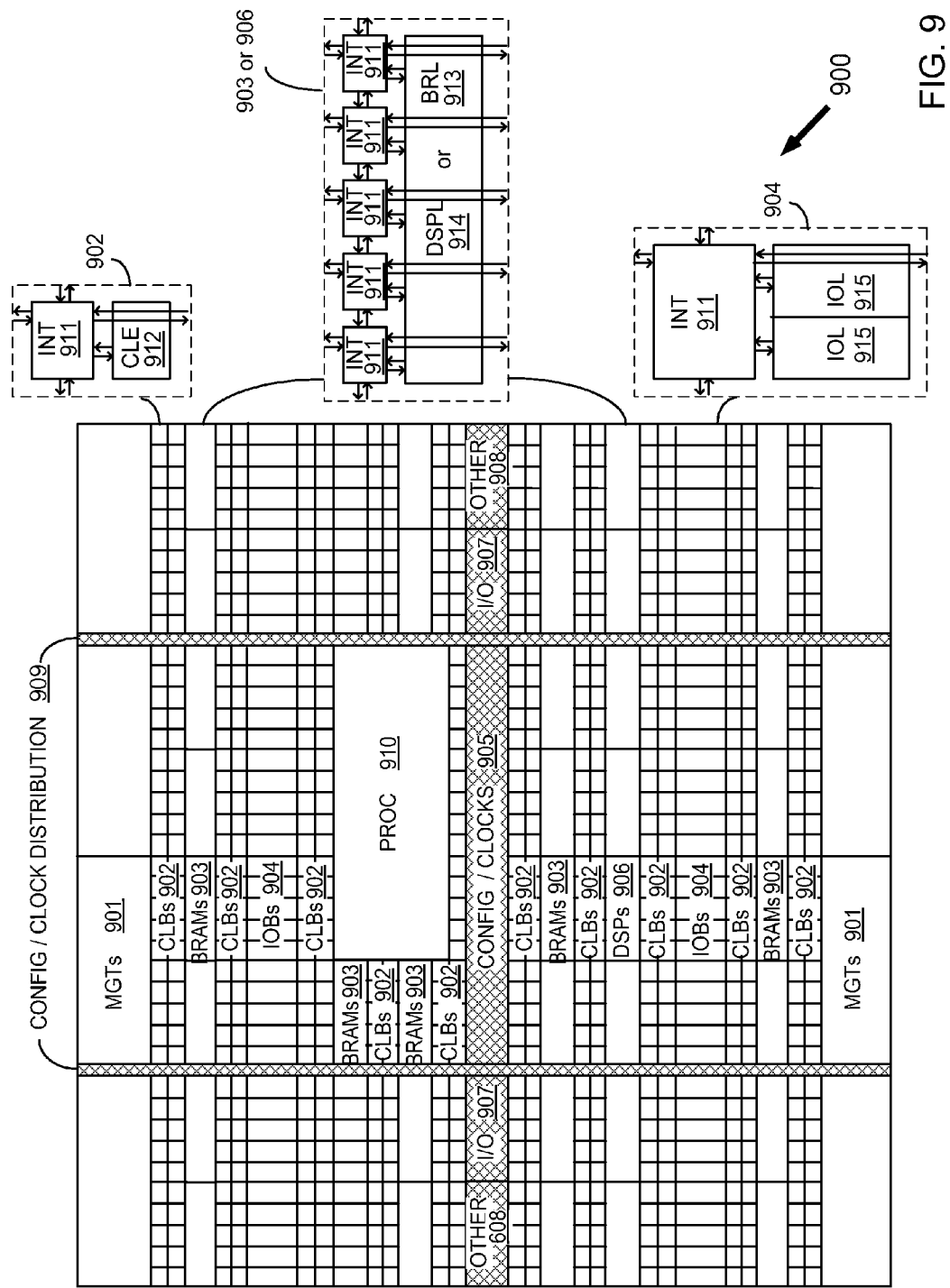
FIG. 9 is a block diagram of a device having programmable resources that may implement the circuits of FIGS. 1-6.

Turning now to FIG. 9, a block diagram of a device having programmable resources including the circuits as implemented in FIGS. 1-6 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured example, a BRAM tile has the same height as five CLBs, but other numbers may also be used. A DSP tile 906 may include a DSP logic element (DSPL) 914 in addition to an appropriate number of programmable interconnect elements. An IOB 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured example, a columnar area near the center of the die is used for configuration, clock, and other control logic. The config/clock distribution regions 99 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While the example of FIG. 9 relates to an integrated circuit having programmable resources, it should be understood that the circuits and methods set forth in more detail below could be implemented in any type of ASIC.

Figure 10:
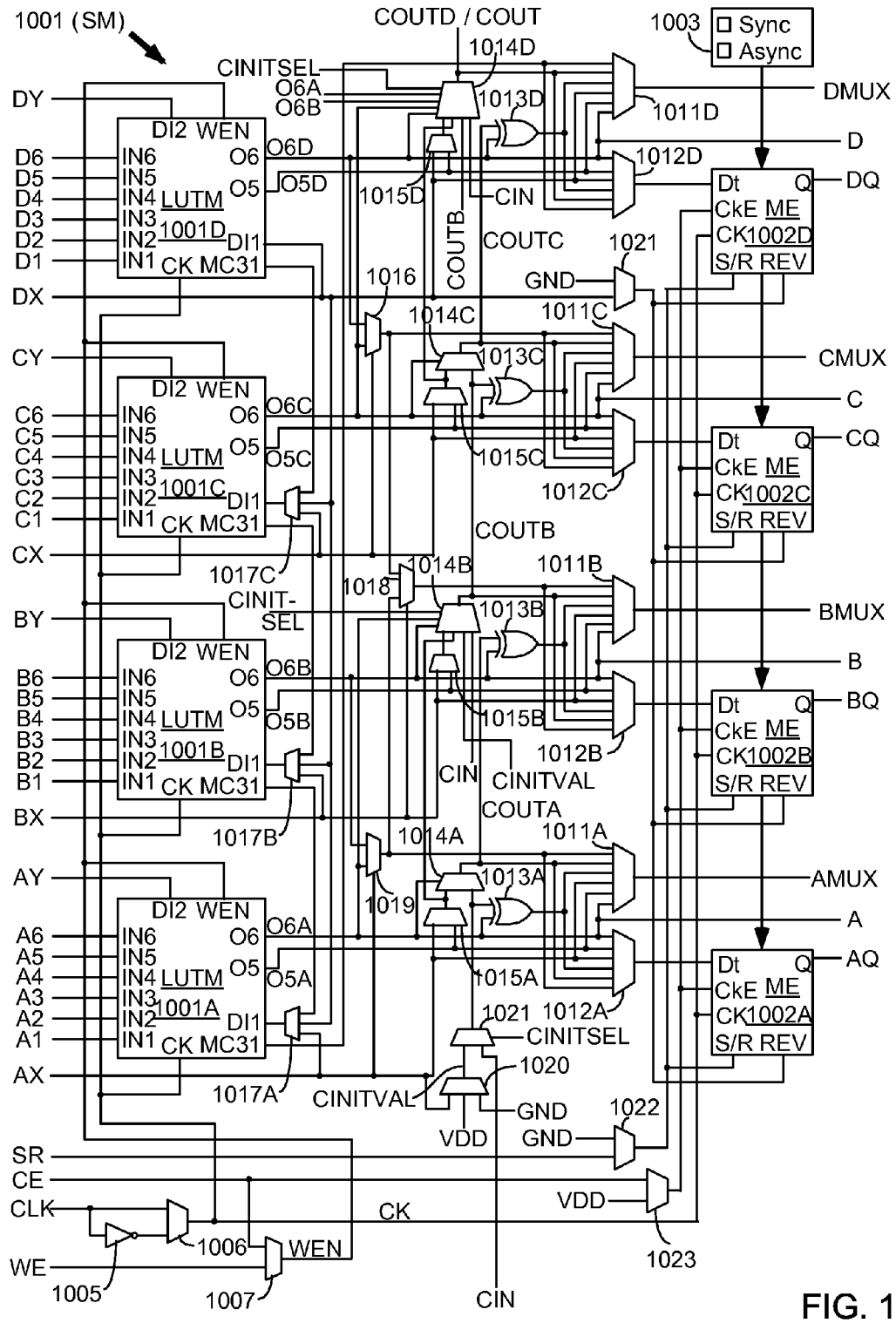
FIG. 10 is a block diagram of a configurable logic element of the device of FIG. 9.

Turning now to FIG. 10, block diagram of a configurable logic element of the device of FIG. 9 is shown. In particular, FIG. 10 illustrates in simplified form a configurable logic element of a configuration logic block 902 of FIG. 9. In the example of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-

1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured example, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the example of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-817C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. Accordingly, the circuits and methods set forth above may be implemented in a device such as the devices of FIGS. 9 and 10, or any other suitable device.

Figure 11:
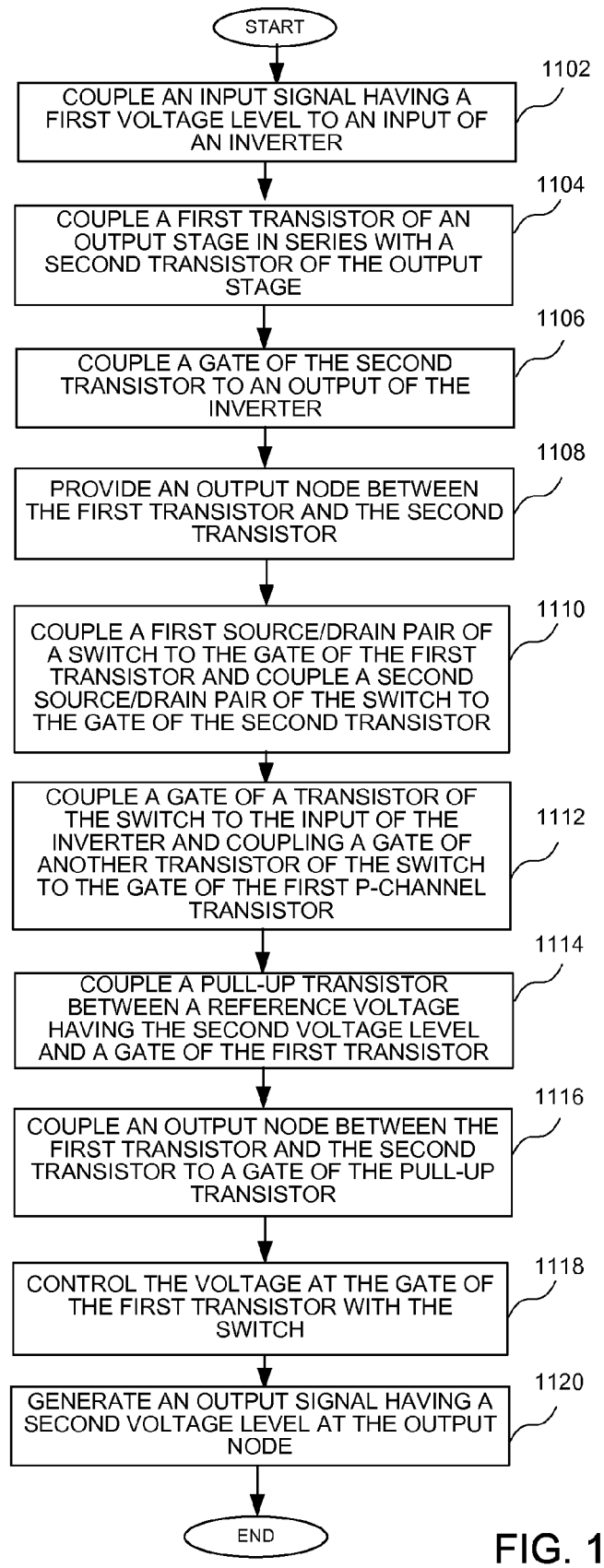
FIG. 11 is a flow chart showing a method of providing voltage level shifting in an integrated circuit device.

Turning now to FIG. 11, a flow chart shows a method of providing voltage level shifting in an integrated circuit device. In particular, an input signal having a first voltage level is coupled to an input of an inverter at a step 1102. A first transistor of an output stage is coupled in series with a second transistor of the output stage at a step 1104. A gate of the second transistor is coupled to an output of the inverter at a step 1106. An output node is provided between the first transistor and the second transistor at a step 1108. A first source/drain pair of a switch is coupled to the gate of the first transistor and a second source/drain pair of the switch is coupled to the gate of the second transistor at a step 1110. A gate of a transistor of the switch is coupled to the input of the inverter and a gate of another transistor of the switch is coupled to the gate of the first p-channel transistor at a step 1112. A pull-up transistor is coupled between a reference voltage having the second voltage level and a gate of the first transistor at a step 1114. An output node is coupled between the first transistor and the second transistor to a gate of the pull-up transistor at a step 1116. The voltage at the gate of the first transistor is controlled with the switch at a step 1118. An output signal having a second voltage level is generated at the output node at a step 1120. While specific elements of the method are described, it should be understood that additional elements of the method, or additional details related to the elements 902-916, could be implemented according to the disclosure of FIGS. 1-10.

It can therefore be appreciated that circuits for and methods of providing level shifting in an integrated circuit device have been described. It will be appreciated by those skilled in the art that numerous alternatives and equivalents will be seen to exist that incorporate the disclosed invention. As a result, the invention is not to be limited by the foregoing examples, but only by the following claims.

What is claimed is:

1. A circuit for providing voltage level shifting, the circuit comprising:
   an inverter having an input coupled to receive an input signal having a first voltage level;
   an output stage having a first transistor coupled in series with a second transistor, and an output node between the first transistor and the second transistor generating an output signal having a second voltage level;
   wherein a gate of the second transistor is coupled to an output of the inverter;
   a pull-up transistor coupled between a reference voltage having the second voltage level and a gate of the first transistor; and
   a switch coupled between the gate of the first transistor and the gate of the second transistor to control a voltage at the gate of the first transistor, wherein:
   the first transistor comprises a first p-channel transistor;
   the second transistor comprises a first n-channel transistor; and
   the switch comprises a second p-channel transistor coupled in parallel with a second n-channel transistor.

2. The circuit of claim 1, wherein a drain of the second n-channel transistor and a source of the second p-channel transistor are coupled to the gate of the first p-channel transistor.

3. The circuit of claim 2, wherein a source of the second n-channel transistor and a drain of the second p-channel transistor are coupled to the gate of the first n-channel transistor.

4. The circuit of claim 1, wherein a gate of the second n-channel transistor is coupled to the input of the inverter.

5. The circuit of claim 4, wherein a gate of the second p-channel transistor is coupled to the gate of the first p-channel transistor.

6. The circuit of claim 1, wherein the output node is coupled to a gate of the pull-up transistor.

7. An integrated circuit comprising:
a first circuit block configured to receive a first reference signal having a first voltage level;
a second circuit block configured to receive a second reference signal having a second voltage level; and
a voltage level shifting circuit coupled to at least one of the first circuit block or the second circuit block, the voltage level shifting circuit comprising:
an inverter having an input coupled to receive an input signal having the first voltage level;
an output stage having a first transistor coupled in series with a second transistor, and an output node between the first transistor and the second transistor generating an output signal having the second voltage level;
wherein a gate of the second transistor is coupled to an output of the inverter;
a pull-up transistor coupled between a reference voltage having the second voltage level and a gate of the first transistor; and
a switch coupled between the gate of the first transistor and the gate of the second transistor to control a voltage at the gate of the first transistor, wherein:
the first transistor comprises a first p-channel transistor;
the second transistor comprises a first n-channel transistor; and
the switch comprises a second p-channel transistor coupled in parallel with a second n-channel transistor.

8. The circuit of claim 7, wherein:
a drain of the second n-channel transistor and a source of the second p-channel transistor are coupled to the gate of the first p-channel transistor; and
a source of the second n-channel transistor and a drain of the second p-channel transistor are coupled to the gate of the first n-channel transistor.

9. The circuit of claim 7, wherein:
a gate of the second n-channel transistor is coupled to the input of the inverter; and
a gate of the second p-channel transistor is coupled to the gate of the first p-channel transistor.

10. The circuit of claim 7, wherein the output node is coupled to a gate of the pull-up transistor.

11. The circuit of claim 7, wherein the first circuit block comprises a configurable logic element and the voltage level shifting circuit.

12. The circuit of claim 7, further comprising:
a plurality of circuit blocks including the first circuit block and the second circuit block, wherein each circuit block of the plurality of circuit blocks includes a configurable logic element and a level shifting circuit.

13. The circuit of claim 7, wherein the second circuit block comprises a configurable logic element and the voltage level shifting circuit.

14. A method of providing voltage level shifting in an integrated circuit, the method comprising:
coupling an input signal having a first voltage level to an input of an inverter;
coupling a first transistor of an output stage in series with a second transistor of the output stage;
coupling a gate of the second transistor to an output of the inverter;
coupling a pull-up transistor between a reference voltage having a second voltage level and a gate of the first transistor;
controlling the voltage at the gate of the first transistor with a switch coupled between the gate of the first transistor and the gate of the second transistor, wherein the switch comprises a p-channel transistor coupled in parallel with an n-channel transistor; and
generating an output signal having the second voltage level at an output node between the first transistor and the second transistor.

15. The method of claim 14, further comprising:
coupling a drain of the n-channel transistor and a source of the p-channel transistor to the gate of the first transistor; and
coupling a source of the n-channel transistor and a drain of the p-channel transistor are to the gate of the second transistor.

16. The method of claim 14, further comprising:
coupling a gate of the n channel transistor to the input of the inverter; and
coupling a gate of the p channel transistor to the gate of the first transistor.

17. The method of claim 14, further comprising coupling the output signal at the output node to a gate of the pull-up transistor.

18. The method of claim 14, further comprising:
implementing a plurality of circuit blocks in the integrated circuit;
wherein each circuit block of the plurality of circuit blocks includes a configurable logic element and a level shifting circuit.

* * * * *